United States Patent
Wong et al.

(10) Patent No.: US 11,006,548 B2
(45) Date of Patent: May 11, 2021

(54) METHOD AND DEVICE TO PROVIDE UNIFORM COOLING IN RUGGED ENVIRONMENTS

(71) Applicant: Emerson Network Power-Embedded Computing, Inc., Tempe, AZ (US)

(72) Inventors: Suzanne Marye Wong, Tempe, AZ (US); Martin Peter John Cornes, Phoenix, AZ (US); Robert Charles Tufford, Chandler, AZ (US)

(73) Assignee: SMART Embedded Computing, Inc., Tempe, AZ (US)

(*) Notice: Subject to any disclaimer, the term of this patent is extended or adjusted under 35 U.S.C. 154(b) by 449 days.

(21) Appl. No.: 13/757,038

(22) Filed: Feb. 1, 2013

(65) Prior Publication Data

US 2014/0217870 A1 Aug. 7, 2014

(51) Int. Cl.
*H05K 7/20* (2006.01)
*F28D 15/02* (2006.01)
(Continued)

(52) U.S. Cl.
CPC ..... *H05K 7/20309* (2013.01); *F28D 15/0233* (2013.01); *F28F 3/02* (2013.01);
(Continued)

(58) Field of Classification Search
CPC ... F28D 15/02; F28D 15/0233; H01L 23/427; H05K 7/20336; H05K 7/20418;
(Continued)

(56) References Cited

U.S. PATENT DOCUMENTS 3,749,156 A * 7/1973 Fletcher ............... B64G 1/50
165/104.14
3,904,933 A * 9/1975 Davis ............... H05K 7/1404
165/80.4
(Continued)

FOREIGN PATENT DOCUMENTS

CN 101102656 A 1/2008

OTHER PUBLICATIONS

English translation of Chinese Office Action for Application No. 201410041874.1, dated Jul. 5, 2016.
(Continued)

*Primary Examiner* — Joel M Attey
*Assistant Examiner* — For K Ling
(74) *Attorney, Agent, or Firm* — Harness, Dickey & Pierce, P.L.C.

(57) ABSTRACT

An electrical equipment cabinet cooling device includes an electrical equipment cabinet having a cabinet outer frame defining an inner perimeter wall. A planar outer cabinet wall is positioned within the inner perimeter wall. A two-phase thermal device includes spaced and opposed first and second transfer walls. An outer perimeter wall connects the first and second transfer walls and defines an interior sealed cavity between the first and second transfer walls. The outer perimeter wall is sized for slidable receipt within the inner perimeter wall. A liquid/vapor retained in the interior sealed cavity acts as a heat transfer medium between the first and second transfer walls. A convective cooling block has a planar end face in direct contact with the second transfer wall. Heat transfers to atmosphere in a path including the outer cabinet wall, the first transfer wall, the liquid/vapor, the second transfer wall, and the cooling block.

14 Claims, 6 Drawing Sheets

(51) Int. Cl.
*F28F 3/02* (2006.01)
*B23P 15/26* (2006.01)

(52) U.S. Cl.
CPC ..... *H05K 7/20336* (2013.01); *H05K 7/20681* (2013.01); *B23P 15/26* (2013.01); *Y10T 29/4935* (2015.01)

(58) Field of Classification Search
CPC ........... H05K 7/20509; H05K 7/20663; H05K 7/20681; H05K 7/208; H05K 7/20818; H05K 7/20881; H05K 7/20936; H05K 7/20409; H05K 7/20545; H05K 7/20536; H05K 7/20554; H05K 7/18
USPC ................. 165/104.21, 104.26, 104.33, 185; 361/679.47, 679.52, 700, 701, 714, 361/679.54, 702, 704, 724
See application file for complete search history.

(56) References Cited

U.S. PATENT DOCUMENTS

| | | | | |
|---|---|---|---|---|
| 4,012,089 A * | 3/1977 | Ward | H05K 7/1421 | 312/236 |
| 4,109,707 A * | 8/1978 | Wilson | F28F 3/12 | 165/170 |
| 4,794,981 A * | 1/1989 | Mizuno | H01L 23/4006 | 165/185 |
| 4,880,052 A * | 11/1989 | Meyer, IV | F28D 15/0233 | 165/104.14 |
| 4,941,530 A * | 7/1990 | Crowe | F28F 3/025 | 165/104.14 |
| 5,291,064 A * | 3/1994 | Kurokawa | H01L 23/057 | 257/706 |
| 5,323,292 A * | 6/1994 | Brzezinski | H01L 23/3675 | 165/104.33 |
| 5,700,342 A * | 12/1997 | Giannetti | H05K 7/1418 | 156/245 |
| 5,829,516 A * | 11/1998 | Lavochkin | F28F 1/22 | 165/171 |
| 5,842,514 A * | 12/1998 | Zapach | H01L 23/427 | 165/104.33 |
| 5,880,524 A * | 3/1999 | Xie | H01L 23/427 | 257/704 |
| 5,896,272 A * | 4/1999 | Hendrix | H05K 7/20545 | 165/104.33 |
| 6,026,565 A * | 2/2000 | Giannatto | H05K 7/1424 | 165/104.33 |
| 6,104,611 A * | 8/2000 | Glover | F28D 15/06 | 165/104.33 |
| 6,133,631 A * | 10/2000 | Belady | F28D 15/0233 | 257/713 |
| 6,166,908 A * | 12/2000 | Samaras | H05K 7/20336 | 165/104.33 |
| 6,169,247 B1 * | 1/2001 | Craft, Jr. | H05K 7/1424 | 174/15.1 |
| 6,374,912 B1 * | 4/2002 | LaGrotta | H05K 7/20409 | 165/104.33 |
| 6,424,528 B1 * | 7/2002 | Chao | H01L 23/427 | 165/104.33 |
| 6,434,000 B1 * | 8/2002 | Pandolfi | F25B 21/02 | 136/204 |
| 6,525,420 B2 * | 2/2003 | Zuo | H01L 23/427 | 257/704 |
| 6,535,388 B1 * | 3/2003 | Garcia | H01L 23/24 | 165/80.3 |
| 6,665,187 B1 * | 12/2003 | Alcoe | H01L 23/10 | 165/185 |
| 6,781,830 B2 * | 8/2004 | Barth | H05K 7/20445 | 165/185 |
| 7,117,930 B2 * | 10/2006 | Todd | F28D 15/0275 | 165/104.21 |
| 7,130,193 B2 * | 10/2006 | Hirafuji | H05K 7/20445 | 165/104.33 |
| 7,209,348 B2 * | 4/2007 | Yazawa | H05K 7/20445 | 165/185 |
| 7,345,877 B2 * | 3/2008 | Asfia | H05K 7/20672 | 165/104.33 |
| 7,411,790 B2 * | 8/2008 | Huang | H01L 23/427 | 165/104.33 |
| 7,418,995 B2 * | 9/2008 | Howard | H05K 7/20918 | 165/121 |
| 7,460,367 B2 * | 12/2008 | Tracewell | H05K 7/20672 | 165/104.21 |
| 7,599,185 B2 * | 10/2009 | Meyer, IV | H01L 23/427 | 165/104.21 |
| 7,755,902 B2 * | 7/2010 | Peng | G06F 1/20 | 165/104.33 |
| 7,800,907 B2 * | 9/2010 | Huang | F28D 15/0233 | 165/104.26 |
| 8,654,523 B2 * | 2/2014 | Adkins | G06F 1/182 | 165/104.21 |
| 8,659,892 B2 * | 2/2014 | Yan | H01L 23/427 | 165/104.33 |
| 2003/0142712 A1 * | 7/2003 | Ikeda | H01S 5/02415 | 372/36 |
| 2004/0085733 A1 * | 5/2004 | Leon | H05K 7/20336 | 361/700 |
| 2005/0051307 A1 * | 3/2005 | Dussinger | F28D 15/046 | 165/104.26 |
| 2005/0286229 A1 * | 12/2005 | Ku | H01L 23/427 | 361/709 |
| 2006/0056155 A1 * | 3/2006 | Lee | H05K 7/209 | 361/700 |
| 2007/0263355 A1 * | 11/2007 | Yu | H01L 23/427 | 361/700 |
| 2007/0295733 A1 * | 12/2007 | Balva | F25D 3/08 | 220/592.2 |
| 2008/0212285 A1 * | 9/2008 | Sun | G06F 1/20 | 361/710 |
| 2009/0009969 A1 * | 1/2009 | Chu | H01L 23/4093 | 361/700 |
| 2009/0059525 A1 * | 3/2009 | Peng | H01L 23/467 | 361/697 |
| 2009/0213537 A1 * | 8/2009 | Heesen | G06F 1/181 | 361/679.47 |
| 2010/0296250 A1 * | 11/2010 | Huang | H05K 7/20518 | 361/700 |
| 2011/0024892 A1 * | 2/2011 | Lin | H01L 23/04 | 257/690 |
| 2011/0100606 A1 * | 5/2011 | Li | F28D 15/0266 | 165/104.26 |
| 2011/0222246 A1 * | 9/2011 | Hsieh | H05K 7/205 | 361/720 |
| 2012/0020017 A1 * | 1/2012 | Kehret | G06F 1/183 | 361/679.54 |
| 2012/0067550 A1 * | 3/2012 | Shih | F28D 15/0233 | 165/104.21 |
| 2012/0211211 A1 * | 8/2012 | Shih | F28D 15/0233 | 165/185 |
| 2012/0216991 A1 * | 8/2012 | Chen | B23P 11/005 | 165/104.21 |
| 2013/0208428 A1 * | 8/2013 | Hui | H05K 7/20418 | 361/720 |
| 2014/0268572 A1 * | 9/2014 | Ranjan | H05K 7/20336 | 361/700 |

OTHER PUBLICATIONS

English translation of Chinese Office Action for Application No. 201410041874.1 dated Mar. 2, 2017.

* cited by examiner

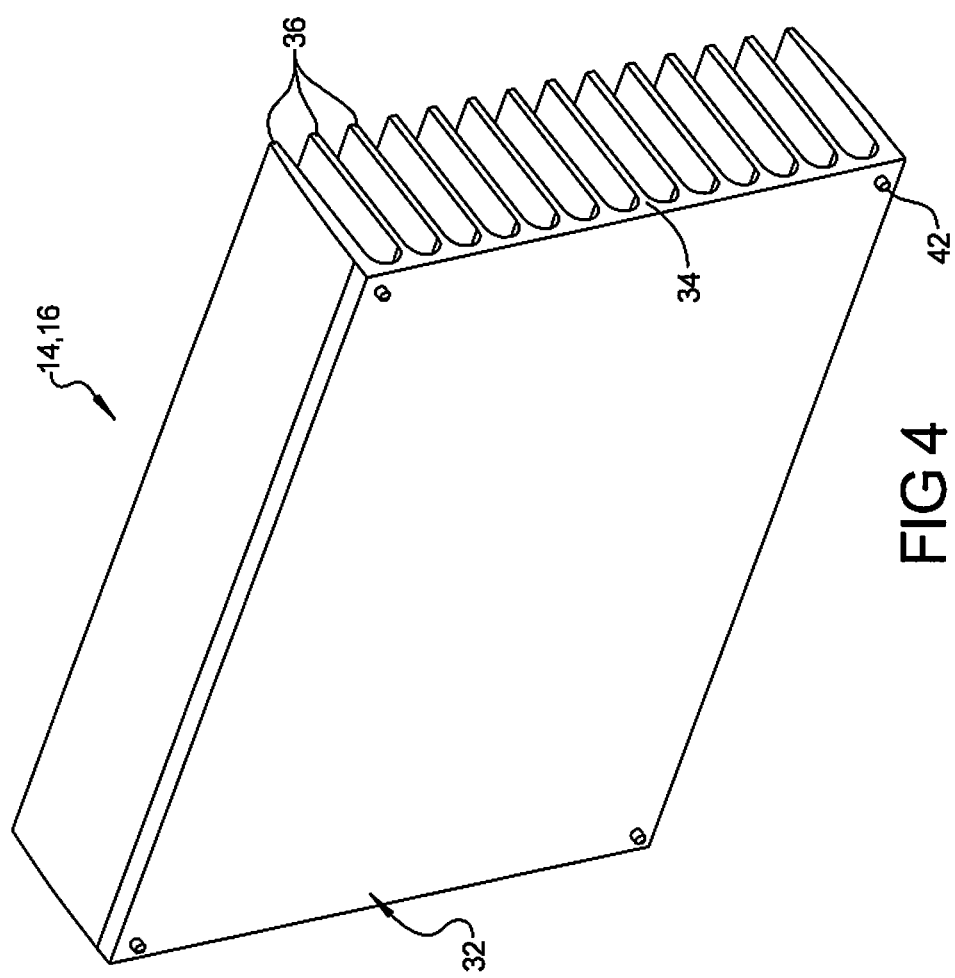

METHOD AND DEVICE TO PROVIDE UNIFORM COOLING IN RUGGED ENVIRONMENTS

FIELD

The present disclosure relates to electrical equipment chassis heat transfer cooling components and method for heat dissipation.

BACKGROUND

This section provides background information related to the present disclosure which is not necessarily prior art.

Portable and field operative electronic components/cabinets such as card cages and radio equipment often require the internal components to be sealed from atmospheric contaminants, moisture, dirt and the like. This limits or prevents the use of flow through ventilation to remove equipment generated heat. Known solutions include the use of external cooling fins, finned attachments, block-machined cooling surfaces and the like to remove heat from the internal components of the cabinet by convective/conductive heat transfer through the outer walls of the cabinet, through the fins to the atmosphere.

Limitations of known cooling fin designs include the inability to cover the entire surface area of the cabinet with fins due to mechanical attachment limitations, hot spots occurring within the cabinets or at the heat transfer surfaces where radiant and convective heat transfer between the internal components and the cooling fin connection blocks are located, and the inability to evenly distribute the heat load across the surface of the finned components.

SUMMARY

This section provides a general summary of the disclosure, and is not a comprehensive disclosure of its full scope or all of its features.

According to several aspects, an electrical equipment cabinet cooling device includes an electrical equipment cabinet having a cabinet outer frame defining an inner perimeter wall creating an outwardly opening cavity. A two-phase thermal device is received in and substantially fills the cavity. The two-phase thermal device includes an interior sealed cavity having a liquid/vapor retained in the interior sealed cavity acting as a heat transfer medium.

According to several aspects, an electrical equipment cabinet cooling system includes an electrical equipment cabinet having a cabinet outer frame defining an inner perimeter wall. A two-phase thermal device includes spaced and opposed first and second transfer walls. An outer perimeter wall connects the first and second transfer walls and defines an interior sealed cavity between the first and second transfer walls. The outer perimeter wall is sized to be slidably received within and contact the inner perimeter wall. A liquid/vapor is retained in the interior sealed cavity acting as a heat transfer medium between the first and second transfer walls.

According to further aspects, an electrical equipment cabinet cooling device includes an electrical equipment cabinet having a cabinet outer frame defining an inner perimeter wall. A planar outer cabinet wall is positioned within the inner perimeter wall. A two-phase thermal device includes spaced and opposed first and second transfer walls. An outer perimeter wall connects the first and second transfer walls and defines an interior sealed cavity between the first and second transfer walls. The outer perimeter wall is sized to be slidably received within the inner perimeter wall. A liquid/vapor retained in the interior sealed cavity acts as a heat transfer medium between the first and second transfer walls. A convective cooling block has a planar end face in direct contact with the second transfer wall.

According to still further aspects, a method for cooling an electrical equipment cabinet is provided. The electrical equipment cabinet includes a cabinet outer frame, a planar outer cabinet wall, and a two-phase thermal device having spaced and opposed first and second transfer walls defining an interior cavity therebetween. The method includes: connecting the cabinet outer frame to the outer cabinet wall creating an outwardly facing cavity of the electrical equipment cabinet; releasably installing the two-phase thermal device in the outwardly facing cavity such that the first transfer wall of the two-phase thermal device directly contacts the outer cabinet wall; and interposing a liquid/vapor in the interior sealed cavity acting as a heat transfer medium between the first and second transfer walls of the two-phase thermal device acting to transfer heat to the atmosphere via a path including the outer cabinet wall, the first transfer wall, the liquid/vapor, and the second transfer wall.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4 is a rear perspective view of a convective cooling block of FIG. 1;

Corresponding reference numerals indicate corresponding parts throughout the several views of the drawings.

DETAILED DESCRIPTION

Example embodiments will now be described more fully with reference to the accompanying drawings.

Figure 1:
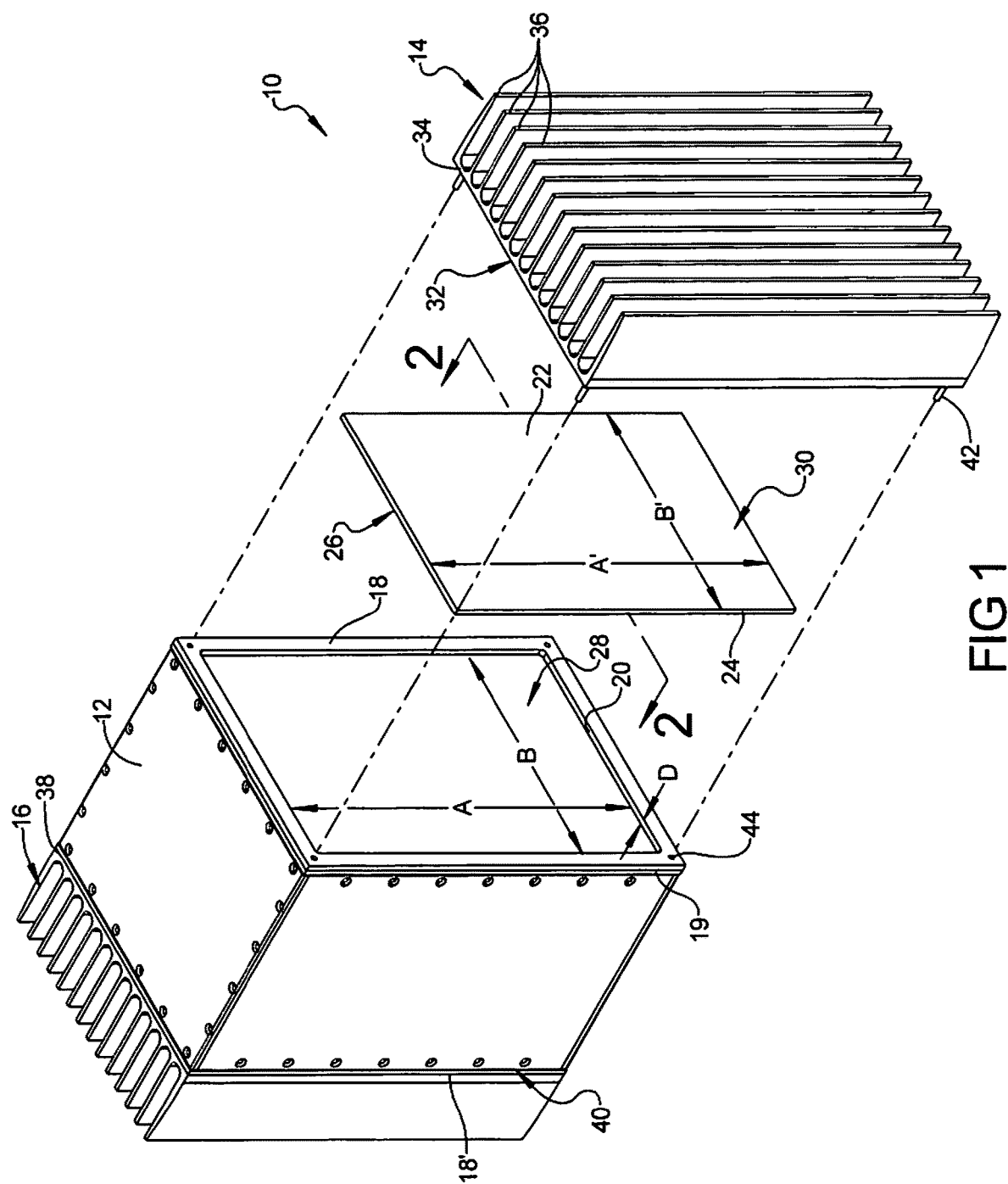
FIG. 1 is a front right exploded perspective view of an electronic component cabinet having two-phase thermal device plates of the present disclosure.

Referring to FIG. 1, a ruggedized equipment cooling system 10 includes an equipment cabinet 12 which internally houses electronic equipment such as radio equipment, electronic cards, and the like. Equipment cabinet 12 is substantially sealed from the outer atmosphere and environment such that heat generated by the internal equipment must be removed conductively through the various walls of equipment cabinet 12. For this purpose, a plurality of finned cooling blocks is provided. In the exemplary embodiment shown, a first finned cooling block 14 is mechanically connected to a first side and a second finned cooling block 16 is oppositely connected to a second side of equipment cabinet 12. Each of the first and second finned cooling blocks 14, 16 are connected to a cabinet outer frame 18, 18'. It should be apparent that first and second finned cooling blocks 14, 16 are not limiting, such that only one finned cooling block can be used, or more than two finned cooling blocks used by connection to other external surfaces of equipment cabinet 12 within the scope of the present disclosure. The cabinet outer frame 18 is connected to a component mount panel 19 which forms one of six outer walls of equipment cabinet 12.

Cabinet outer frame 18 provides on at least one outer surface of equipment cabinet 12 an inner perimeter wall 20 defining an open faced cavity which slidably receives a two-phase thermal device 22. According to several aspects, individual two-phase thermal devices 22 are positioned between the component mount panel 19 of equipment cabinet 12 and each of the first and second finned cooling blocks 14, 16 and can be removable. Each two-phase thermal device 22 is sized to slidably fit within the cavity defined by inner perimeter wall 20 such that an outer perimeter wall 24 of each two-phase thermal device 22 extends for at least an entire depth "D" of the inner perimeter wall 20 so that the two-phase thermal device 22 substantially fills the cavity created by inner perimeter wall 20. Each two-phase thermal device 22 has a first two-phase thermal device wall face 26 which according to several aspects is substantially planar such that substantially all of a surface area (e.g., the exposed height A×width B) of a first outer cabinet wall 28, which is a portion of component mount panel 19 exposed within inner perimeter wall 20, is directly contacted by a surface area (height A'×width B') of first two-phase thermal device wall face 26 of two-phase thermal device 22. This direct contact ensures maximum heat transfer between first outer cabinet wall 28 and first two-phase thermal device wall face 26.

An oppositely facing second two-phase thermal device wall face 30 of two-phase thermal device 22 directly faces and directly contacts a first cooling block planar end face 32 of first finned cooling block 14. A surface area of each of the first and second finned cooling blocks 14, 16 is at least equal to or greater than a surface area of second two-phase thermal device wall face 30 of two-phase thermal devices 22 to also provide surface area for mechanical mounting of the first and second finned cooling blocks 14, 16 to the cabinet outer frames 18, 18'. Similar to first two-phase thermal device wall face 26, second two-phase thermal device wall face 30 is also substantially planar to align with the substantially planar first cooling block planar end face 32, thereby maximizing the surface area (height A'×width B') in direct contact between each two-phase thermal device 22 and the first and second finned cooling blocks 14, 16.

The first cooling block planar end face 32 defines a planar face of a first cooling block wall 34 of first finned cooling block 14 from which also extend a plurality of cooling fins 36. Each of the first and second finned cooling blocks 14, 16 can provide the individual cooling fins 36 as cast members, machined members, integrally connected members (for example by brazing or welding), or mechanically connected members. The material and geometry of cooling fins 36 is selected to maximize convective heat transfer away from equipment cabinet 12. The second finned cooling block 16, similar to first finned cooling block 14, includes a second cooling block wall 38 which directly contacts a second outer cabinet wall 40 of equipment cabinet 12, which can be similarly sized and shaped as first outer cabinet wall 28.

According to other aspects, any of the outer surfaces of equipment cabinet 12 can include an outer frame portion defining a perimeter wall adapted to receive a two-phase thermal device similar to two-phase thermal device 22. The geometry of any of the two-phase thermal devices of the present disclosure can be adapted to suit the geometry of equipment cabinet 12. Therefore, the geometry and thickness of any of the two-phase thermal devices of the present disclosure can have any geometric shape necessary, such as rectangular, square, triangular, oval, round, or the like.

Each of the finned cooling blocks, such as first finned cooling block 14 shown, is mechanically connected to equipment cabinet 12, for example using a plurality of fasteners 42 connected via a plurality of fastener apertures 44. In the embodiment shown, fasteners 42 are threaded shank fasteners adapted to be received in threaded fastener apertures 44, thereby capturing two-phase thermal device 22 between first outer cabinet wall 28 and first cooling block planar end face 32. Heat transfer between the various surfaces of two-phase thermal device 22 and both equipment cabinet 12 and the first and second finned cooling blocks 14, 16 can also be enhanced by the use of a temperature conductive adhesive or coupling compound applied to the various faces of two-phase thermal device 22 and either or both of the associated equipment cabinet face and planar end faces of two-phase thermal devices 22. For ease of disassembly of equipment cabinet 12 for maintenance, it is anticipated that additional adhesives or attachment methods other than the use of fasteners 42 may not be required.

Referring to FIG. 2 and again to FIG. 1, an exemplary geometry for two-phase thermal device 22 for a rectangular shaped inner perimeter wall 20 includes a first transfer wall 46, having first two-phase thermal device wall face 26, and an oppositely directed second transfer wall 48, having second two-phase thermal device wall face 30. Oppositely positioned first and second edge walls 50, 52 together with first and second transfer walls 46, 48 (top and bottom edge walls are not shown in this view for clarity) define an interior sealed cavity 54 within outer perimeter wall 24. To maximize heat transfer between first and second transfer walls 46, 48, a liquid/vapor 56 such as a water/antifreeze mixture is sealed within interior sealed cavity 54. The use of liquid/vapor 56 maximizes a total heat transfer throughout the entire surface area of a first interior transfer wall 58 to an oppositely positioned second interior transfer wall 60. The use of liquid/vapor 56 also limits or minimizes the impact of hot spots across the various faces of two-phase thermal device 22 because the liquid/vapor 56 will achieve a homogeneous temperature more quickly than a solid wall of metal that is commonly used for finned cooling blocks. The interior sealed cavity 54 also ensures that the volume of liquid/vapor 56 remains constant over time and prevents contamination products from entering interior sealed cavity 54 or outward leakage of liquid/vapor 56. A plurality of methods can be used to seal interior sealed cavity 54. For example brazing, welding, and the like procedures can be used when completing the construction of two-phase thermal device 22.

Figure 2:
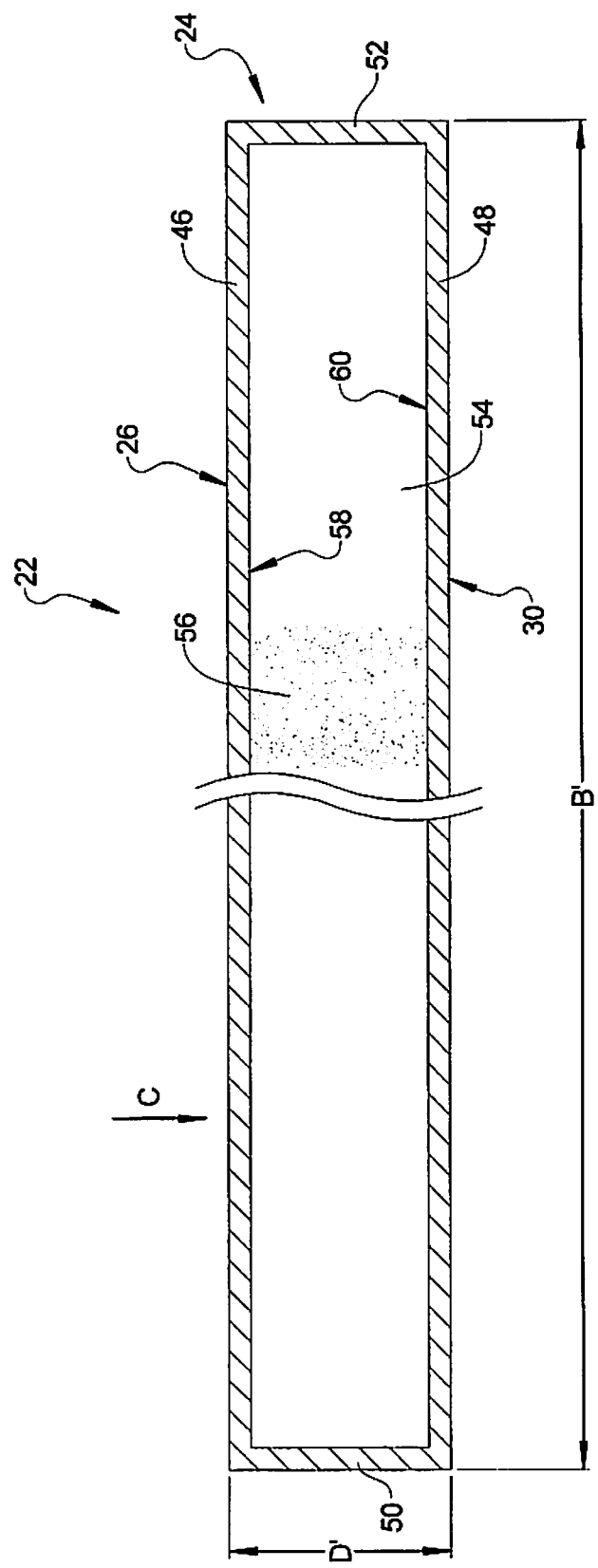
FIG. 2 is a cross sectional top plan view of a two-phase thermal device plate of FIG. 1.

A heat transfer path "C" denoted in FIG. 2 represents a normal heat transfer directional path between equipment cabinet 12 and the plurality of cooling fins 36 by conductive/convective heat transfer through liquid/vapor 56. Heat transferred is uniformly spread from outer cabinet wall 28 to atmosphere in path "C" which includes the outer cabinet wall 28, the first transfer wall 46, the liquid/vapor 56, the second transfer wall 48, and the cooling block 14. To ensure maximum surface area contact of both the first outer cabinet wall 28 and the first cooling block planar end face 32 by two-phase thermal device 22, a depth D' of two-phase thermal device 22 is at least equal to or greater than a corresponding depth D (shown in FIG. 1) provided at first outer cabinet wall 28 by inner perimeter wall 20. According to several aspects, the planar first outer cabinet wall 28 is positioned and exposed within the inner perimeter wall 20, with the inner perimeter wall 20 oriented normal (at a right angle) to the outer cabinet wall 28. In order to maximize the heat transfer capability provided by the liquid/vapor 56 within interior sealed cavity 54, the wall thicknesses of the various outer walls of two-phase thermal device 22, including first and second transfer walls 46, 48 and first and second edge walls 50, 52, are minimized. A material used for construction of two-phase thermal device 22 is also selected to maximize the heat transfer capability of the two-phase thermal device 22, while also allowing for the increase in pressure that will occur within interior sealed cavity 54 as the temperature of liquid/vapor 56 increases during use.

Referring to FIG. 3 and again to FIGS. 1-2, the equipment cabinet 12 after assembly encloses each of the two-phase thermal devices 22. For example, one two-phase thermal device 22 is enclosed between component mount panel 19, cabinet outer frame 18, and first cooling block wall 34, such that the two-phase thermal devices 22 are not exposed to atmosphere or atmospheric contaminants. Equipment cabinet 12 can also include one or more non-finned cabinet panels 62 defining top, bottom, back, front or side panels of equipment cabinet 12.

Figure 3:
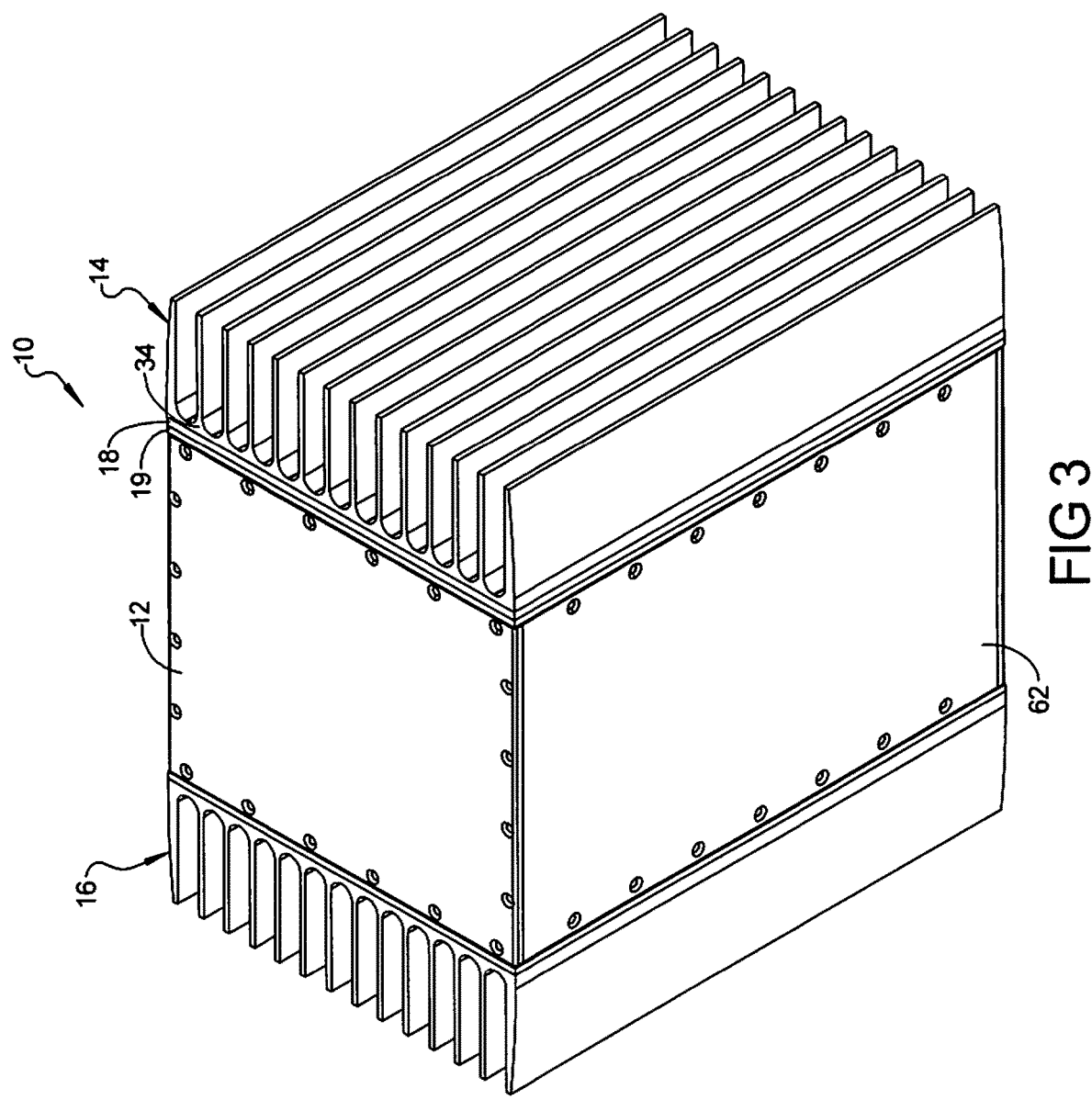
FIG. 3 is a front right perspective view of the electronic component cabinet of FIG. 1 after assembly.

Referring to FIG. 4 and again to FIGS. 1-3, each of the finned cooling blocks such as first and second finned cooling blocks 14, 16 provide for mounting of fasteners 42, which according to several aspects can be alignment pins or threaded fasteners. The cooling fins 36 are generally equally spaced and except for the end fins are all substantially equally shaped. In the embodiment shown in FIG. 4, the cooling fins 36 are integrally connected to first cooling block wall 34 during manufacture of first and second finned cooling blocks 14, 16.

Referring to FIG. 5 and again to FIG. 1, component mount panels 19 each include the planar outer cabinet wall such as first outer cabinet wall 28 having fastener receiving apertures 66 created therein. Fastener receiving apertures 66 coaxially align with individual ones of the fastener apertures 44 created in the cabinet outer frames 18. At least one and according to several embodiments multiple integrally connected component mount racks 68 are connected to component mount panels 19 on a side oppositely facing with respect to first outer cabinet wall 28. Heat generated by components (not shown) mounted to the component mount racks 68 within equipment cabinet 12 is transferred conductively to the cabinet outer walls such as such as first outer cabinet wall 28.

Figure 6:
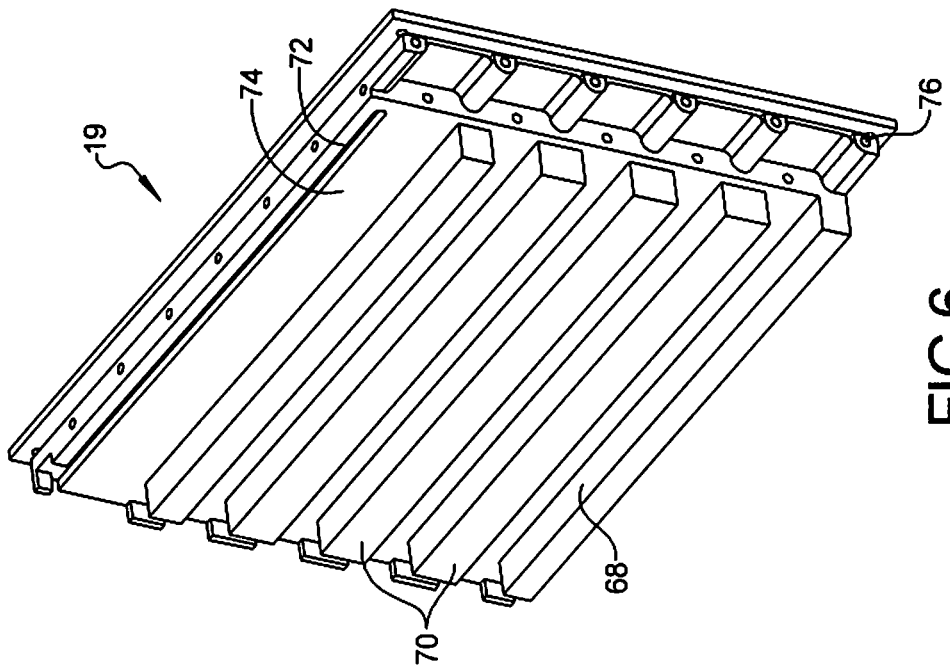
FIG. 6 is a rear left perspective view of the component mount panel of FIG. 5.
Figure 5:
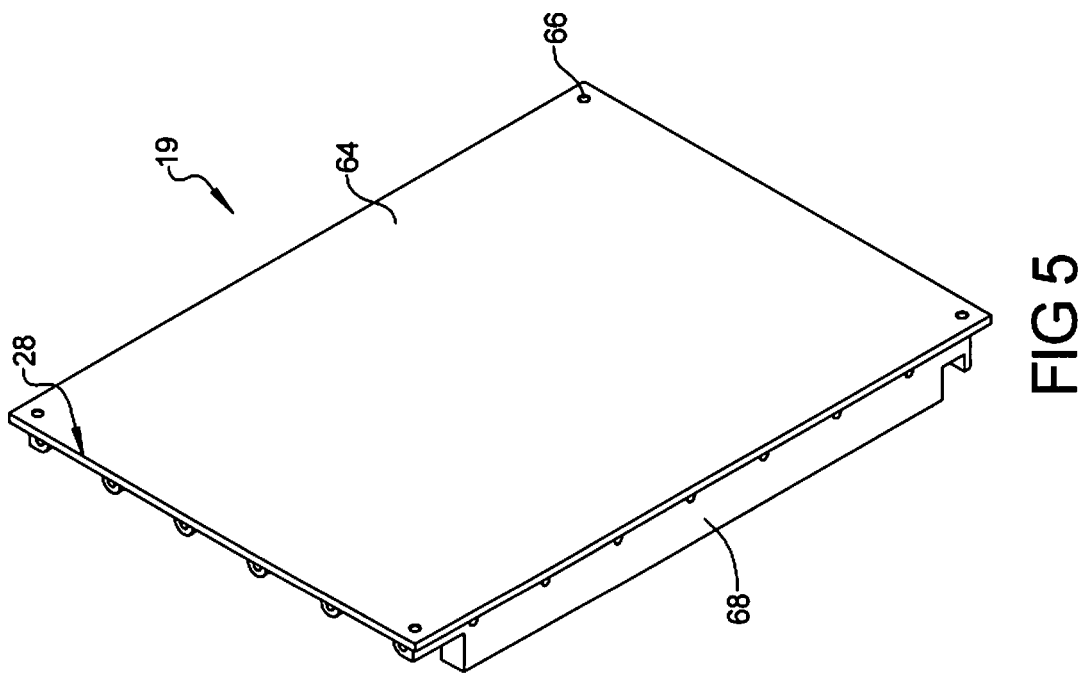
FIG. 5 is a front right perspective view of a component mount panel of the cabinet of FIG. 1.

Referring to FIG. 6 and again to FIG. 5, in addition to the integrally connected component mount racks 68, component mount panels 19 can also include multiple releasably mounted component mount racks 70 which can be connected to elongated slots 72 created in an inner panel face 74 of component mount panels 19. One, and according to several embodiments multiple alignment receptacles 76 can be provided to align and retain the electrical components with the individual component mount racks 68, 70 and to receive fasteners used to mount non-finned cabinet panels 62.

Figure 7:
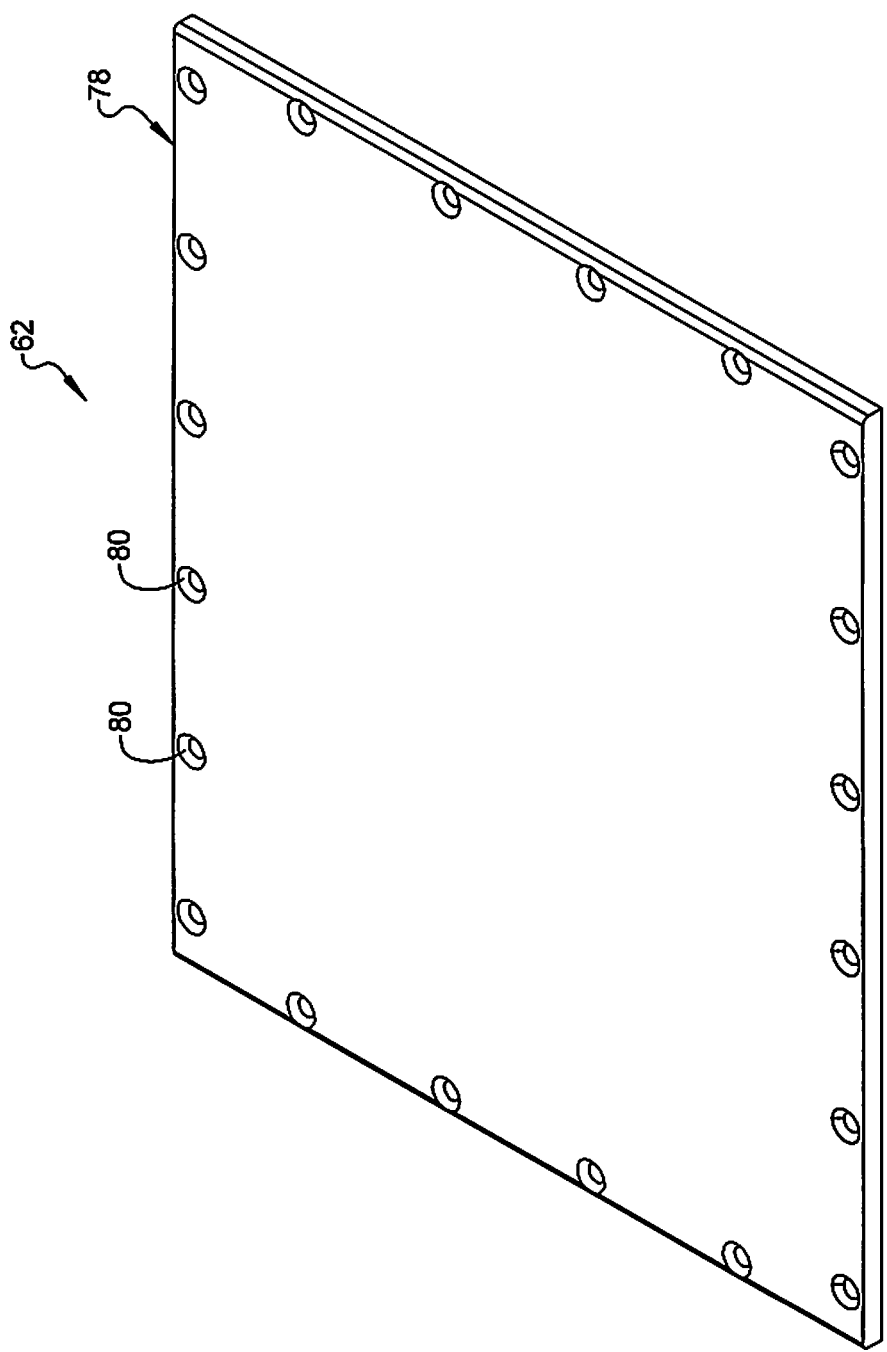
FIG. 7 is a top perspective view of a non-finned cabinet panel of FIG. 1.

Referring to FIG. 7 and again to FIG. 1, non-finned cabinet panels 62 have outwardly facing planar surfaces 78. Multiple apertures 80 can be provided about a perimeter of non-finned cabinet panels 62 which receive fasteners (not shown) for mounting non-finned cabinet panels 62 to the component mount panels 19 of equipment cabinet 12.

Two-phase thermal devices of the present disclosure offer several advantages over the use of commonly known finned heat transfer cooling blocks. The use of liquid/vapor 56 as a heat transfer medium maximizes heat transfer across the overall surfaces of two-phase thermal device 22 while minimizing the occurrence of localized hot spots proximate to the heat generating components in equipment cabinet 12. The use of a sealed interior sealed cavity 54 ensures that the volume of liquid/vapor 56 remains constant and is free of contaminants that could degrade the overall heat transfer capability. The design of two-phase thermal devices 22 of the present disclosure also provides for fixing the two-phase thermal devices such as by solder or epoxy/adhesive.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.).

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electrical equipment cabinet cooling device, comprising:
    a sealed electrical equipment cabinet including outer walls defining a single sealed space;
    an outer frame separate from and fastened to one of the outer walls of the sealed electrical equipment cabinet using fasteners to prevent relative movement between the electrical cabinet and the outer frame, the outer frame including two pairs of opposing frame members, each of the outer frame members being fastened to a respective outer edge of the one of the outer walls and connected to respective ends and defining an opening within the two pairs of opposing frame members of substantially a same surface area as the one of the outer walls, wherein opposing walls of the opposing frame members define an inner perimeter wall creating an outwardly opening cavity adjacent to the sealed electrical equipment cabinet;
    a two-phase thermal device received in and substantially filling the cavity, the two-phase thermal device including an interior sealed cavity having a liquid/vapor retained in the interior sealed cavity acting as a heat transfer medium, wherein the two-phase thermal device includes spaced and parallel first and second transfer walls defining the interior sealed cavity; and
    a finned cooling block having a planar end face, wherein substantially all of a surface area of the second transfer wall is in direct contact with the planar end face of the finned cooling block,
    wherein the two-phase thermal device includes an outer perimeter wall in proximity to the inner perimeter wall and connecting the first and second transfer walls and defining the interior sealed cavity, and
    wherein the outer frame is further configured to releasable receive the two-phase thermal device in the cavity defined by the inner perimeter wall, and the finned cooling block is configured to retain the two-phase thermal device, and the two-phase thermal device and outer frame are configured so that the two-phase thermal device may be removed while the outer frame remains fastened to the electrical cabinet.

2. The electrical equipment cabinet cooling device of claim 1, wherein the outer perimeter wall is sized to be slidably received within and contact the inner perimeter wall.

3. An electrical equipment cabinet cooling device, comprising:
    an electrical equipment cabinet having three pairs of opposing side walls defining a single sealed space;
    an outer frame separate from and fastened to one of the side walls of the electrical equipment cabinet using fasteners to prevent relative movement between the electrical cabinet and the outer frame, the outer frame having four sides, and each side of the outer frame is fastened to a respective outer edge of the one of the side walls and connected end-to-end to define a closed structure having an opening surrounding an entirety of the one of the side walls therethrough, wherein opposing walls of the four sides define an inner perimeter wall;
    a two-phase thermal device including:
        spaced and opposed first and second transfer walls;
        an outer perimeter wall connecting the first and second transfer walls and defining an interior sealed cavity between the first and second transfer walls, the outer perimeter wall sized to be slidably received within and contact the inner perimeter wall; and
        a liquid/vapor retained in the interior sealed cavity acting as a heat transfer medium between the first and second transfer walls; and
    a finned cooling block having a planar face, wherein substantially all of a surface area of the first transfer wall is in direct contact with the planar face of the finned cooling block,
    wherein the two-phase thermal device is releasably received in the cavity defined by the inner perimeter wall and retained by the finned cooling block and the two-phase thermal device and outer frame are configured so that the two-phase thermal device may be removed while the outer frame stays fastened to the electrical cabinet.

4. The electrical equipment cabinet cooling device of claim 3, wherein the first transfer wall includes a planar first two-phase thermal device wall face.

5. The electrical equipment cabinet cooling device of claim 4, further including a planar outer cabinet wall positioned within the inner perimeter wall and directly contacted by the second transfer wall of the two-phase thermal device.

6. The electrical equipment cabinet cooling device of claim 5, wherein a surface area of the planar outer cabinet wall is substantially equal to a surface area of the second transfer wall of the two-phase thermal device.

7. The electrical equipment cabinet cooling device of claim 4, wherein the second transfer wall includes a planar second two-phase thermal device wall face oppositely facing and parallel with respect to the first transfer wall.

8. The electrical equipment cabinet cooling device of claim 3, wherein the first and second transfer walls are parallel to each other and are each planar.

9. The electrical equipment cabinet cooling device of claim 3, further including:
    a component mount panel having the outer frame connected thereto; and at least one integrally connected component mount rack connected to the component mount panel.

10. The electrical equipment cabinet cooling device of claim 3, further including a planar outer cabinet wall positioned within the inner perimeter wall wherein the inner perimeter wall is oriented normal to the planar outer cabinet wall.

11. An electrical equipment cabinet cooling device, comprising:
   an electrical equipment cabinet having outer walls defining a single sealed space;
   an outer frame separate from and fastened to the electrical equipment cabinet using fasteners to prevent relative movement between the electrical cabinet and the outer frame, the outer frame including opposing rails each disposed in proximity to a respective perimeter of one of the outer walls of the electrical equipment cabinet, wherein facing walls of opposing rails define an inner perimeter wall, the one of the outer walls defining a planar outer cabinet wall, each rail of the outer frame being connected to the planar outer cabinet wall to define an opening of substantially a same surface area as the outer wall;
   a two-phase thermal device including:
      spaced and opposed first and second transfer walls;
      an outer perimeter wall connecting the first and second transfer walls and defining an interior sealed cavity between the first and second transfer walls, the outer perimeter wall sized to be slidably received within the opening and directly contacting the inner perimeter wall, and the first transfer wall directly contacts the planar outer cabinet wall; and
      a liquid/vapor retained in the interior sealed cavity acting as a heat transfer medium between the first and second transfer walls; and
   a convective cooling block having a planar end face in direct contact with the second transfer wall,
   wherein substantially all of a surface area of the second transfer wall is in direct contact with the planar end face of the convective cooling block,
   wherein the two-phase thermal device is releasably received in the cavity defined by the inner perimeter wall and retained by the convective cooling block and the two-phase thermal device and outer frame are configured so that the two-phase thermal device may be removed while the outer frame stays fastened to the electrical cabinet.

12. The electrical equipment cabinet cooling device of claim 11, wherein in an assembled condition of the electrical equipment cabinet, substantially all of a surface area of the second transfer wall is in direct contact with the planar end face of the convective cooling block, and substantially all of a surface area of the first transfer wall is in direct contact with the planar outer cabinet wall.

13. The electrical equipment cabinet cooling device of claim 11, wherein the convective cooling block includes multiple cooling fins extending oppositely with respect to the planar end face.

14. The electrical equipment cabinet cooling device of claim 11, wherein the convective cooling block is fastened to at least one of the outer frame or the planar outer cabinet wall such that both the cooling block and the two-phase thermal device are releasably connected.

* * * * *